US008643083B2

(12) United States Patent
Hance et al.

(10) Patent No.: US 8,643,083 B2
(45) Date of Patent: Feb. 4, 2014

(54) ELECTRONIC DEVICES WITH ULTRAVIOLET BLOCKING LAYERS

(75) Inventors: Bryon K. Hance, Austin, TX (US);
Brian D. White, Kyle, TX (US);
William Brennan, Austin, TX (US);
Joseph W. Wiseman, Austin, TX (US);
Allen Evans, Dripping Springs, TX (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/465,600

(22) Filed: May 7, 2012

(65) Prior Publication Data

US 2012/0218700 A1 Aug. 30, 2012

Related U.S. Application Data

(62) Division of application No. 11/962,714, filed on Dec. 21, 2007, now Pat. No. 8,171,627.

(51) Int. Cl.
*H01L 29/792* (2006.01)
*H01L 23/48* (2006.01)
*H01L 23/52* (2006.01)
*H01L 29/40* (2006.01)

(52) U.S. Cl.
USPC ........... 257/324; 257/325; 257/326; 257/758; 257/E23.011; 257/E23.141; 257/E23.145

(58) Field of Classification Search
USPC .......... 257/324–326, 758, E23.011, E23.141, 257/E23.145
See application file for complete search history.

(56) References Cited

U.S. PATENT DOCUMENTS

| | | | |
|---|---|---|---|
| 4,982,250 A | 1/1991 | Manos, II et al. | |
| 5,312,778 A | 5/1994 | Collins et al. | |
| 5,723,358 A * | 3/1998 | Manley | 438/600 |
| 5,817,438 A * | 10/1998 | Chen et al. | 430/5 |
| 5,825,080 A * | 10/1998 | Imaoka et al. | 257/659 |
| 5,827,778 A | 10/1998 | Yamada | |
| 5,854,124 A * | 12/1998 | Lin | 438/620 |
| 5,918,147 A | 6/1999 | Filipiak et al. | |
| 5,981,993 A * | 11/1999 | Cho | 257/311 |
| 6,765,254 B1 | 7/2004 | Hui et al. | |
| 6,833,581 B1 | 12/2004 | Hui et al. | |
| 6,893,971 B2 | 5/2005 | Tanabe et al. | |
| 6,989,563 B1 * | 1/2006 | Achuthan et al. | 257/315 |
| 7,018,896 B2 * | 3/2006 | Ngo et al. | 438/261 |
| 7,060,627 B2 | 6/2006 | Gutman et al. | |
| 7,091,088 B1 * | 8/2006 | Cheng et al. | 438/257 |
| 7,732,923 B2 * | 6/2010 | Wu et al. | 257/760 |
| 7,749,892 B2 * | 7/2010 | Bonilla et al. | 438/624 |
| 7,790,292 B2 * | 9/2010 | Colborn et al. | 428/447 |
| 8,269,210 B2 * | 9/2012 | Cheng et al. | 257/10 |
| 2004/0256978 A1 | 12/2004 | Yu et al. | |
| 2006/0196948 A1 * | 9/2006 | Weber et al. | 235/487 |

* cited by examiner

*Primary Examiner* — Ida M Soward
(74) *Attorney, Agent, or Firm* — Sterne, Kessler, Goldstein & Fox P.L.L.C.

(57) ABSTRACT

Devices and systems for insulating integrated circuits from ultraviolet ("UV") light are described. The device includes a conductive feature, a first and second UV blocking layer, a first and second insulating layer, and a conductive structure. The first insulating layer overlays the first UV blocking layer. A via opening extends through the first insulating layer and the first UV blocking layer. The second UV blocking layer overlays the first insulating layer. The second insulating layer overlays the second UV blocking layer. An interconnect trench is defined in the second insulating layer and second UV blocking layer. The conductive structure is electrically connected to the conductive feature and extends into the via opening and along the interconnect trench.

20 Claims, 12 Drawing Sheets

ELECTRONIC DEVICES WITH ULTRAVIOLET BLOCKING LAYERS

CROSS-REFERENCE TO RELATED APPLICATION

The present application is a divisional of U.S. patent application Ser. No. 11/962,714, entitled "METHOD OF FORMING AN ELECTRONIC DEVICE," filed on Dec. 21, 2007, the entirety of which is herein incorporated by reference.

BACKGROUND

1. Field of the Disclosure

This disclosure relates to processes of forming electronic devices, and more particularly, electronic devices with ultraviolet blocking layers and processes of forming the same.

2. Description of the Related Art

Nonvolatile memory ("NVM") cells can be erased or otherwise have the charge stored within the NVM cells altered by ultraviolet ("UV") radiation. When fabricating the NVM cells, UV radiation can be produced during etching. A UV blocking layer can be included within the memory array in an attempt to block UV radiation from reaching the NVM cells.

FIG. 1 includes an illustration of a cross-sectional view of a portion of a workpiece that includes a substrate 100, NVM memory cells, and layers formed over the NVM memory cells 110 and 112. More specifically, the workpiece includes source/drain regions 102, 104, and 106 within the substrate 100. A charge storage stack 120 is formed over the substrates and gate electrodes 124 and 126 overlying the charge storage stack 120. Sidewall spacers 128 lie along opposite sides of the gate electrodes 124 and 126. An interlevel dielectric layer 160 is formed over the gate electrodes 124 and 126 and the charge storage stack 120. The interlevel dielectric layer 160 includes an insulating layer 142 having a thickness of at least 450 nm and is substantially transparent to UV radiation. The interlevel dielectric layer 160 also includes a UV blocking layer 162, another insulating layer 164, and an antireflective layer 166 are formed over the insulating layer 142. The UV blocking layer 162 can include a silicon-rich trichlorosilane nitride. A patterned resist layer 182 is formed over the antireflective layer 166, and the pattern resist layer 182 defines an opening 184.

During a first portion of an etching sequence, a plasma, including reactive ions illustrated as solid-line arrows 192, are directed toward the surface of the workpiece. The reactive ions are affected by an electrical field and travel toward the workpiece in a direction substantially perpendicular to a primary surface of the workpiece. The plasma also generates UV radiation, illustrated as dashed-line arrows 194 in FIG. 1. The UV radiation travels toward the workpiece in a variety of directions; the direction in which UV radiation travels is not affected by the electrical field. The UV radiation is transmitted through the antireflective layer 166 and the insulating layer 164. The UV blocking layer 162 may prevent a substantial portion of the UV radiation from reaching the insulating layer 142 and portions of the workpiece below the insulating layer 142. UV radiation may or may not be transmitted through the patterned resist layer 182.

FIG. 2 includes an illustration of the workpiece later during the etching process sequence after the opening 260 has been formed through the antireflective layer 166, the insulating layer 164, and the UV blocking layer 162. After the UV blocking layer 162 has been patterned, the UV radiation can now pass through the insulating layer 142 and reach the gate electrodes 224 and 126 and the charge storage stack 120 of the memory cells 110 and 112. When the UV radiation reaches the charge storage stack 120, the charge within the charge storage stack 120 can be altered. Because etching through the insulating layer 142 will take a significant amount of time, the charge storage stack 120 can receive a substantial amount of the UV radiation, and thus, change the charge of the charge storage stack 120. Thus, an attempt to reduce problems, mostly UV radiation generated during an etch process, has been unsuccessful in preventing the charge within the charge storage stack 120 from being altered during a contact or via etch process sequence.

BRIEF DESCRIPTION OF THE DRAWINGS

The present disclosure may be better understood, and its numerous features and advantages made apparent to those skilled in the art by referencing the accompanying drawings.

Figure 1:
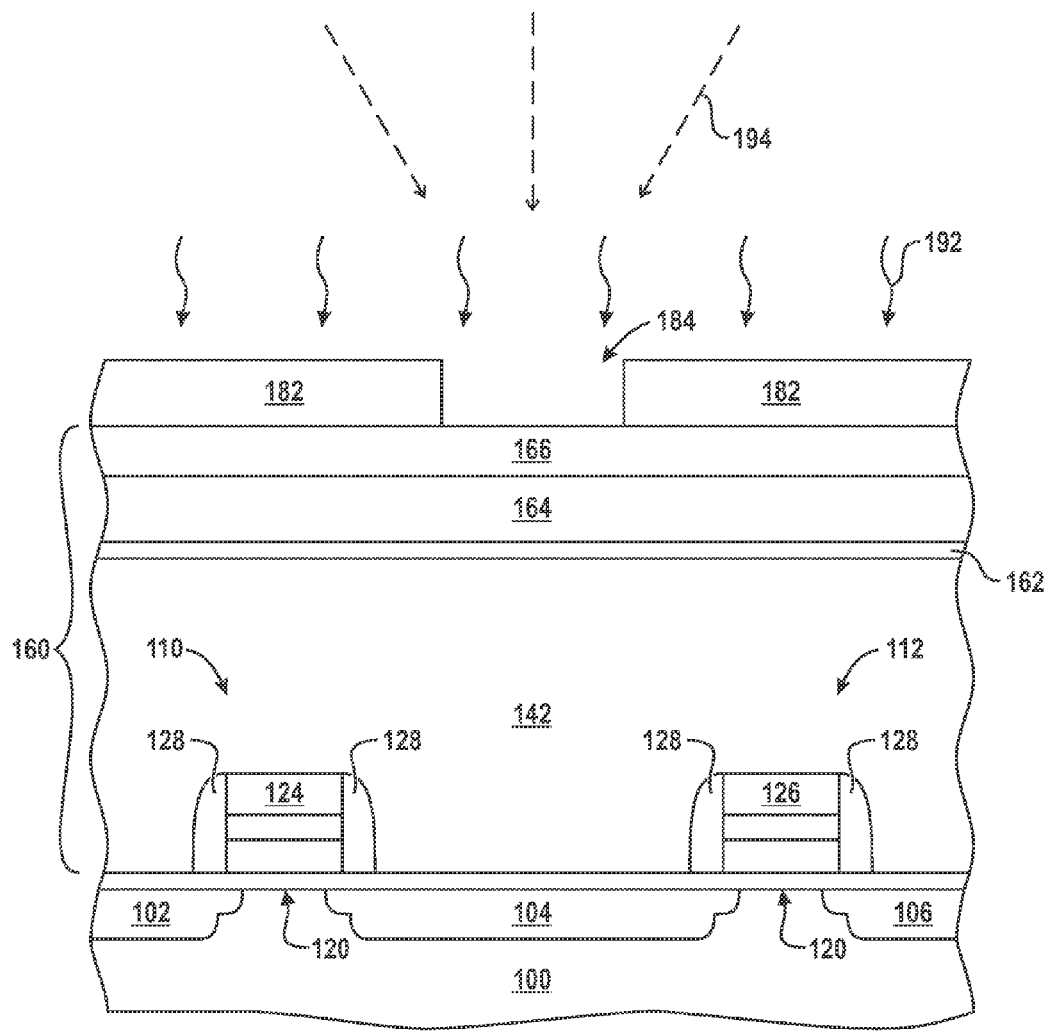
FIG. 1 includes an illustration of a cross-sectional view of a portion of a workpiece when beginning to etch an opening. (Prior art)

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device that includes memory cells or other electronic components that are sensitive to UV radiation can be protected from such UV radiation by using a UV blocking layer that is located closer to the memory cells or other electronic components that are to be protected, as compared to other layers within an interlevel dielectric ("ILD"). Thus, a higher intensity of UV radiation generated in plasmas used in etching films and depositing films can be tolerated when fabricating an electronic device. The UV blocking layer can reduce the likelihood that UV radiation changes a charge or otherwise interferes with the normal operation of such memory cells, electronic components, or portions thereof. For example, channel punchthrough, threshold voltage, another electrical parameter, or any combination thereof may be improved when the UV blocking layer is present during plasma processing The UV blocking layer can be included as the first or lowest layer within an ILD. As used herein, an ILD is a layer or a plurality of layers within or through which an interconnect is formed and extends to an underlying conductive feature (e.g., a source/drain region, a gate electrode, an emitter region, a collector contact region, an extrinsic base region, a contact plug, an interconnect, or a suitable conductive structure) at a different level. One level can include a component level that includes transistors, resistors, capacitors, diodes or the like, wherein the transistors, resistors, capacitors, diodes or the like include a portion that is mostly a semiconductor material (e.g., silicon, germanium, or the like). Another level can include a first interconnect level that can include a plurality of (1) contact plugs and interconnects and a corresponding dielectric that laterally surrounds at least the contact plugs or (2) conductive structures including contact portions and interconnect portions and a corresponding dielectric that laterally surrounds the conductive structures. Yet another level can include a second interconnect level that can include a plurality of (1) via plugs and interconnects and a corresponding dielectric that laterally surrounds at least the via plugs or (2) conductive structures including via portions and interconnect portions and a corresponding dielectric that laterally surrounds the conductive structures.

In another embodiment, a first layer of an ILD can include an etch-stop layer or an adhesion layer as the first or lowest layer, and the UV blocking layer is formed over the first layer. A substantially thicker insulating layer is formed over the UV blocking layer, such that when the insulating layer is etched using a plasma, UV radiation from the plasma will be blocked by the UV blocking layer.

In one aspect, a process of forming an electronic device can include forming a ultraviolet blocking layer over a conductive feature, wherein the UV blocking layer lies within 90 nm of the conductive structure. The process can further include forming an insulating layer over the UV blocking layer, and patterning the insulating layer and the UV blocking layer to form an opening extending to the conductive feature. During the process, the UV blocking layer is exposed to UV radiation.

In another aspect, an electronic device can include a conductive feature, a UV blocking layer, an insulating layer, and a conductive structure. The UV blocking layer can overlie the conductive feature. The insulating layer can overlie the first UV blocking layer and be at least 4 times thicker than the UV blocking layer. The conductive structure can extend into a first opening within the first insulating layer and the UV blocking layer, wherein the conductive structure is electrically connected to the conductive feature.

Attention is now directed to processes for forming an electronic device that includes a UV blocking layer. The information is provided to aid in understanding particular details, and is not to limit the present invention.

Figure 3:
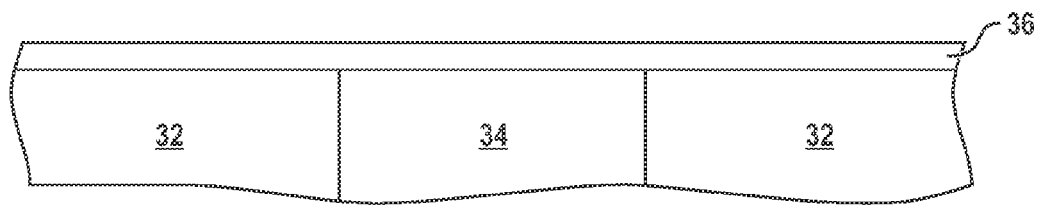
FIG. 3 includes an illustration of a cross-sectional view of a portion of a workpiece after forming a UV blocking layer.

FIG. 3 includes an illustration of a cross-sectional view of a portion of a workpiece that includes an insulating layer 32 and a conductive structure 34 that extends through the insulating layer 32. The insulating layer 32 can include an oxide, a nitride, an oxynitride, or any combination thereof. The insulating layer 32 can include a single film or may include a plurality of films. The conductive structure 34 can include a conductive plug, such as a contact plug or a via plug, an interconnect, another suitable structure for routing a voltage or other signal, or any combination thereof. The conductive structure 34 can include a single film or a plurality of films. The insulating layer 32 and the conductive structure 34 can be formed using conventional or proprietary techniques.

Although not illustrated, a substrate and electronic components formed within or over the substrate can underlie the insulating layer 32. The electronic components can include memory cells, logic circuits, other suitable electronic circuits used in microelectronic devices, or any combination thereof. In one particular embodiment, the components can include NVM cells. The conductive structure 34 may be electrically connected to a gate electrode or a source/drain region of a NVM memory cell.

An ILD that includes a plurality of layers is formed over the insulating layer 32 and the conductive structure 34. The ILD includes a UV blocking layer 36 that is formed over the insulating layer 32 and the conductive structure 34. In one particular embodiment, the UV blocking layer 36 is formed directly on the insulating layer 32, the conductive structure 34, or both. Thus, in one particular embodiment, within the ILD being formed, the UV blocking layer 36 is the closest layer to the insulating layer 32, the conductive structure 34, or both. In another embodiment, the UV blocking layer 36 can be formed no more than 90 nm, no more than 50 nm, or no more than 20 nm from the insulating layer 32, the conductive structure 34, or both. For example, an intervening layer, such as an etch-stop or adhesion layer (not illustrated), may be formed after forming the insulating layer 32 and the conductive structure 34 and before forming the UV blocking layer 36. The etch-stop or adhesion layer has a composition different from the UV blocking layer 36. For example, if the UV blocking layer is an oxide, the etch-stop layer can be a nitride.

The UV blocking layer 36 has a composition and thickness sufficient to block a significant portion of UV radiation, and therefore, a significant amount of UV radiation can be blocked before reaching the substrate or electronic components. The UV blocking layer 36 can include a single film or may include a plurality of films. In one embodiment, the UV blocking layer 36 can include a silicon-rich insulating layer, such as a silicon-rich oxide, a silicon-rich nitride, a silicon-rich oxynitride, or any combination thereof. In a particular embodiment, the UV blocking layer 36 can include silicon in an amount of approximately 30% to approximately 70% above the stoichiometric amount of silicon needed for the corresponding oxide, nitride, or oxynitride. For example, a silicon-rich oxide can include approximately 0.8 atoms of silicon for each atom of oxygen, and a silicon-rich nitride can include approximately 1.0 atoms of silicon for each atom of nitrogen. For a silicon-rich oxynitride, the number will depend in part on the relative amounts of oxygen and nitrogen present within the UV blocking layer 36.

The silicon source for the UV blocking layer 36 can include a compound having the formula below.

$Si_aH_bX_c$, wherein X is a halogen (Cl, Br, I or the like), a is 1 to 3, (b+c)=(2a+2), and b or c can be as low as 0 (i.e., H or X not present in the compound). When the UV blocking layer 36 includes oxygen, the oxygen source and can include molecular oxygen, ozone, nitrous oxide, another suitable oxygen-containing compound, or any combination thereof. When the UV blocking layer 36 includes nitrogen, the nitrogen source can include ammonia, molecular nitrogen, hydrazine, another suitable nitrogen-containing compound, or any combination thereof. After reading this specification, skilled artisans will be able to select appropriate silicon and other source gases in appropriate amounts to achieve the needed or desired composition. The other deposition parameters one forming the UV blocking layer 36 can be conventional or proprietary.

The UV blocking layer 36 has a thickness sufficient to reduce transmission of UV radiation by a significant amount. Although no upper theoretical limit on the thickness of the UV blocking layer 36 is known, other considerations may provide a practical limit for the UV blocking layer 36. For example, etch complexity, equipment throughput, or another consideration may effectively limit the thickness of the UV blocking layer 36. In one embodiment, the UV blocking layer 36 has a thickness no greater than 200 nm or no greater than 90 nm, and in another embodiment, the UV blocking layer 36 has a thickness of at least 11 nm or a thickness of at least 30 nm. In one particular embodiment, the UV blocking layer 36 has a thickness in a range of approximately 40 nm to approximately 70 nm. In another embodiment the UV blocking layer 36 can be thinner or thicker than the thicknesses previously described.

Figure 4:
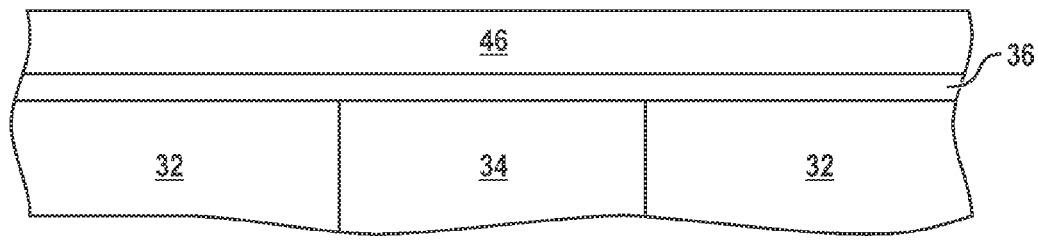
FIG. 4 includes an illustration of a cross-sectional view of the workpiece of FIG. 3 after forming an insulating layer over the UV blocking layer.

FIG. 4 includes an illustration of a cross-sectional view of the workpiece after forming an insulating layer 46 over the UV blocking layer 36. The insulating layer 46 can include and oxide, a nitride, and oxynitride, or any combination thereof. The insulating layer 46 can include a single film or may include a plurality of films. In one embodiment, the insulating layer 46 is at least 4 times thicker or at least 8 times thicker than the UV blocking layer 36. The insulating layer 46 can have a thickness no greater than 2000 nm, no greater than 1500 nm, or no greater than 900 nm, and in another embodiment the insulating layer 46 can have a thickness of at least 110 nm, at least 300 nm, or at least 500 nm. The insulating layer 46 may or may not be formed using a plasma in forming the insulating layer 46, such as plasma-enhanced chemical vapor deposition. If UV radiation would be generated by the plasma, the UV blocking layer 36 can reduce the likelihood that a significant amount of UV radiation would reach the underlying components that may be sensitive to UV radiation. Other than the presence or absence of a plasma during deposition, the insulating layer 46 can be formed using a conventional or proprietary technique.

Figure 5:
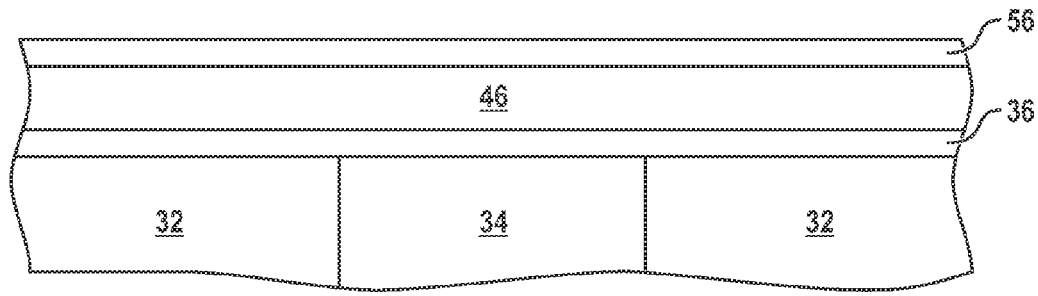
FIG. 5 includes an illustration of a cross-sectional view of the workpiece of FIG. 4 after forming another UV blocking layer.

FIG. 5 includes an illustration of a cross-sectional view of the workpiece after forming another UV blocking layer 56 over the insulating layer 46. The UV blocking layer 56 can be formed using any of the materials, thicknesses, and deposition techniques previously described with respect to the UV blocking layer 36. The UV blocking layer 56 can have the same or different composition, the same or different thickness, and be formed using the same or different deposition techniques as described with respect to the UV blocking layer 36. In one particular embodiment, the UV locking layers 36 and 56 have substantially the same composition and have thicknesses that are within approximately 20% of each other.

Figure 6:
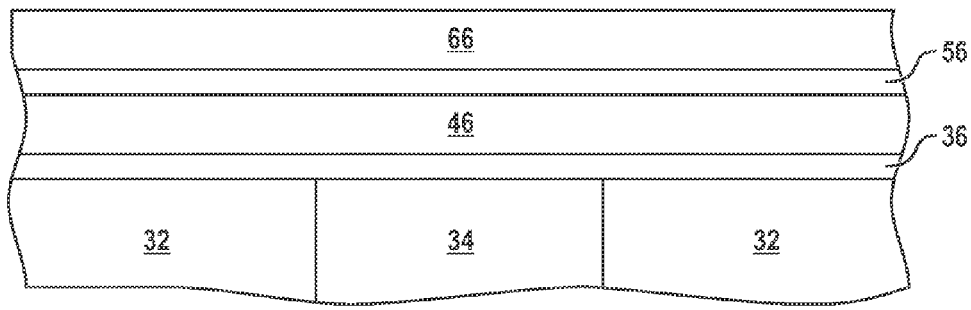
FIG. 6 includes an illustration of a cross-sectional view of the workpiece of FIG. 7 after forming another insulating layer over the other UV blocking layer.

FIG. 6 includes an illustration of a cross-sectional view of the workpiece after forming another insulating layer 66 over the UV blocking layer 56. The insulating layer 66 can be formed using any of the materials, thicknesses, and deposition techniques previously described with respect to the insulating layer 46. The insulating layer 66 can have the same or different composition, the same or different thickness, and be formed using the same or different deposition techniques, as described with respect to the insulating layer 46. In one particular embodiment, the insulating layers 46 and 66 have substantially the same composition and have thicknesses that are within approximately 50% of each other.

Figure 7:
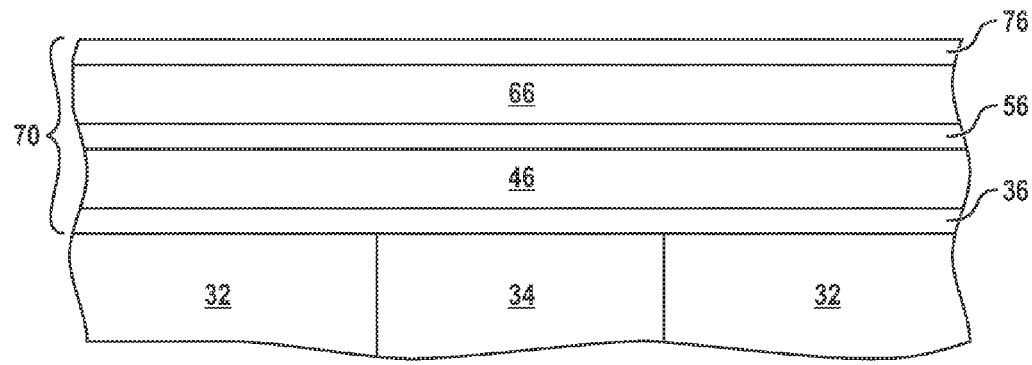
FIG. 7 includes an illustration of a cross-sectional view of the workpiece of FIG. 6 after forming an antireflective layer over the other insulating layer.

FIG. 7 includes an illustration of a cross-sectional view of the workpiece after forming an antireflective layer 76. The composition and thickness of the antireflective layer 76 are selected to significantly reduce the amount of radiation reflected during a subsequent resist patterning operation. The antireflective layer 76 can include an organic or inorganic compound. When the antireflective layer 76 includes an inorganic compound, the inorganic compound can include a silicon-oxygen compound, a silicon-nitrogen compound, a silicon-oxygen-nitrogen compound, a metal oxide, a metal nitride, a metal oxynitride, a metal-semiconductor-oxygen compound, a metal-semiconductor-nitrogen compound, a metal-semiconductor-oxygen-nitrogen compound, or any combination thereof. The metallic element can include aluminum, molybdenum, tantalum, titanium, tungsten, or another suitable metallic element, or any combination thereof. The semiconductor element can include silicon, germanium, or another suitable semiconductor element, or any combination thereof. In a particular embodiment, the antireflective layer 76 includes silicon oxynitride, silicon-rich silicon oxide, or silicon-rich nitride.

The thickness of the antireflective layer 76 can depend on the wavelength of radiation used to pattern the subsequently-formed resist layer and the composition of the anti-or reflective layer 76. In one particular embodiment, the antireflective layer 76 has a thickness in a range of approximately 25 to 60 nm when the antireflective layer 76 includes silicon oxynitride and the radiation source emits radiation at an emission maximum at 356 nm (i-line). A different range of thicknesses may be used if the emission maximum is changed. The antireflective layer 76 can be formed using a conventional or proprietary technique.

At this point in the process, the ILD 70 has been formed and includes the layers 36, 46, 56, 66, and 76. The ILD 70 can be patterned to define openings in which conductive structures can be formed. Many different processing sequences can be used to form the openings. In one embodiment for a dual-inlaid interconnect, a via-first, trench-second process sequence, a trench-first, via-second process sequence, or a hybrid process sequence may be used. FIGS. 8 to 15 illustrate a hybrid process sequence that is described in more detail below.

Figure 8:
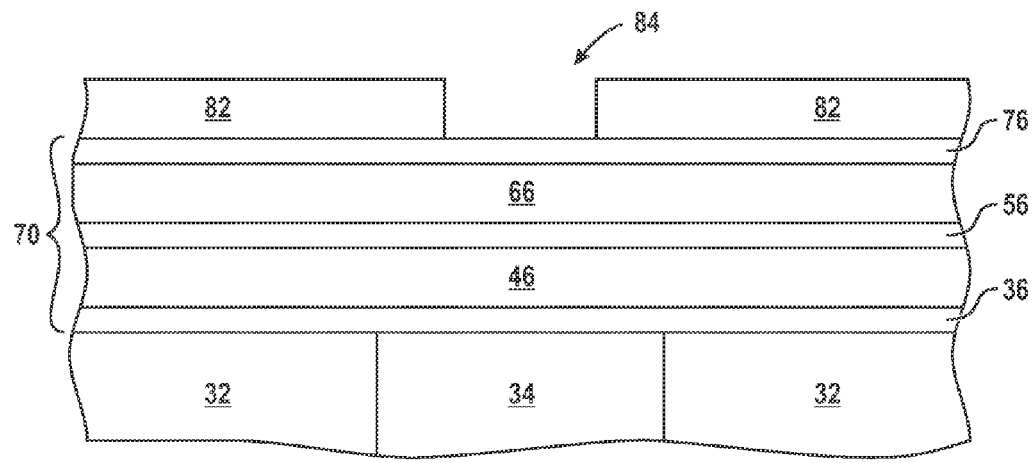
FIG. 8 includes an illustration of a cross-sectional view of the workpiece of FIG. 7 after forming a pattern resist layer over the antireflective layer.

FIG. 8 includes an illustration of a cross-sectional view of a portion of the workpiece after forming a patterned masking layer 82 over the ILD 70. The patterned masking layer 82 can include an organic or inorganic material. The patterned masking layer 82 can include a single film or a plurality of films. In one particular embodiment, the patterned masking layer 82 is a resist material that can be can be selectively exposed using a reticle and subsequently developed to form the patterned masking layer 82 that defines an opening 84 that overlies the conductive structure 34. After reading this specification, skilled artisans will appreciate that other techniques can be used in forming the patterned masking layer 82.

Before describing the etching of the ILD 70, a few details regarding plasma etching are addressed. The amount of UV radiation generated during plasma etching may depend on the radio frequency ("RF") and power used to generate the plasma. In one particular embodiment, the UV radiation may be generated when the RF used in generating the plasma is in a range of approximately 25 MHz to approximately 29 MHz. In another embodiment, the UV radiation can be generated when the RF is at approximately 14 MHz or approximately 60 MHz. At approximately the same power, the UV radiation generated is more intense for the RF range of approximately 25 MHz to 29 MHz, as compared to approximately 14 MHz or approximately 60 MHz. Therefore, concepts described herein can be used for different frequencies and may be particularly advantageous to those in which particular frequencies that tend to generate more UV radiation for a particular power, a particular gas mixture, or any combination thereof.

The RF used in generating the plasma is typically fixed by the tool vendor and cannot be changed at the location where the etching tool operates (e.g., a customer site). Without the UV blocking layers 36 and 56, skilled artisans had to choose between (1) using a lower power and having an increased etch time or (2) using a higher power and dealing with complications caused by the relatively high intensity UV radiation. Because the UV blocking layers 36 and 56 are present, a relatively high power can be used during any part of the etching sequence without the UV radiation significantly disturbing the electronic components that underlie the insulating layer 32, the conductive structure 34, or both. In one embodiment, when the substrate has a nominal 200 mm substrate, the power can exceed 1000 watts or 1500 watts. The limit on power used may be determined by the power supply (e.g., 2000 watts) or by other process constraints that are unrelated to UV radiation. The power can also be a function of the area occupied by the workpiece. Thus, the power used for a nominal 300 mm substrate may be approximately 2.3 times larger than the power used for the nominal 200 mm substrate.

Figure 9:
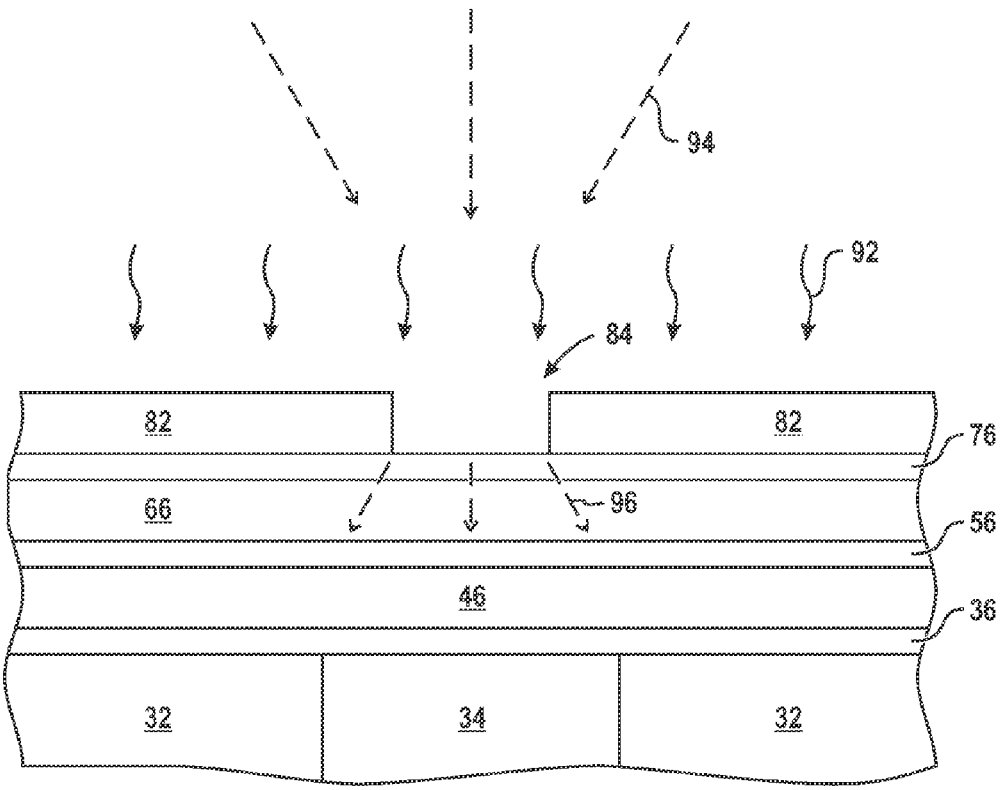
FIG. 9 includes an illustration of a cross-sectional view of the workpiece of FIG. 8 when beginning to etch the antireflective layer.

Attention is now directed to etching the workpiece. FIG. 9 includes an illustration of a cross-sectional view of the workpiece near the beginning of an etching sequence. Reactive ions, illustrated as solid-line arrows 92, are directed towards the workpiece. The ions are generated within a plasma and travel substantially perpendicular to a primary surface of the workpiece due to the presence of an electrical field within the etching chamber.

A significant amount of UV radiation, illustrated as dashed-line arrows 94 in FIG. 9, is also generated. The UV radiation can be emitted in many different directions and is not determined by the electrical field. UV radiation that enters the workpiece is illustrated as dashed-line arrows 96.

The UV radiation can pass through the patterned resist layer 82 but is not illustrated in order to illustrate better how the UV blocking layers 36 and 56 can block UV radiation during patterning of insulating layer 66 in forming openings for conductive structures. In one particular embodiment, the UV radiation can be transmitted through the antireflective layer 76 and the insulating layer 66. The UV blocking layer 56 does not allow any significant amount of UV radiation to be transmitted to underlying portions of the workpiece.

Figure 10:
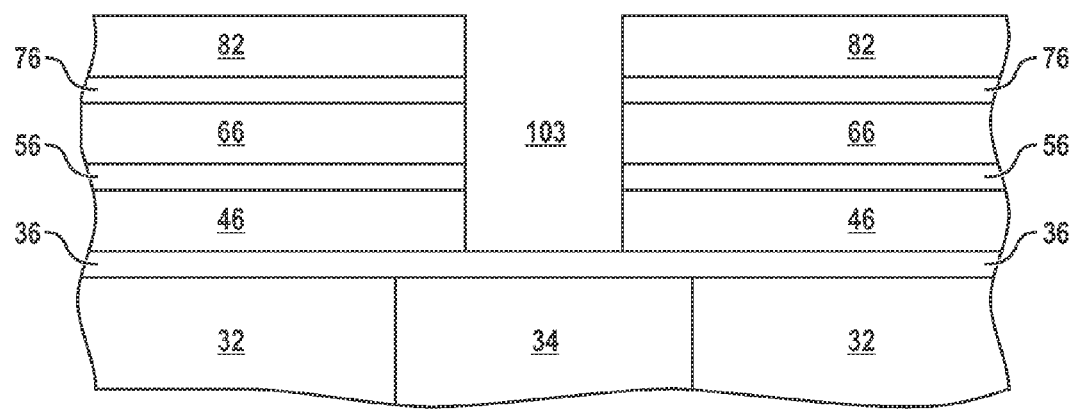
FIG. 10 includes an illustration of a cross-sectional view of the workpiece of FIG. 8 after etching an opening through the antireflective and upper insulating layers.

The etching is continued to form an opening 103 that extends through the antireflective layer 76, the insulating layer 66, the UV blocking layer 56, and the insulating layer 46, as illustrated in FIG. 10. The etching chemistry for etching the antireflective layer 76, the insulating layer 66, and the insulating layer 46 can include a fluorine-containing chemistry. The fluorine concentration within the plasma could be higher when etching the UV blocking layer 56 than when etching the insulating layers 46 and 66. The higher fluorine concentration is better at etching silicon-rich compounds, as compared to an etch chemistry tailored more particularly for $SiO_2$ or $Si_3N_4$. All other etching parameters can be conventional or proprietary. The power, etching chemistry, another suitable etching parameter, or any combination thereof may be the same or different when etching any particular layer, as compared to the other layers.

In an alternative embodiment (not illustrated), more or fewer layers may be etched when forming the opening. For example, the opening can be extended through the UV blocking layer 36 until the conductive structure 34 is reached. If the opening 103 would extend to the conductive structure 34, a traditional via etch would be performed, as part of a via-first, trench-second process sequence. In another embodiment, only the antireflective layer 76 and insulating layer 66 may be etched using the masking layer 82, and the upper UV blocking layer 56 and the lower insulating layer 46 can remain and be etched during subsequent processing.

During the etching sequence, components near the primary surface of the substrate remain protected from UV radiation. More specifically, after the exposed portion of the UV blocking layer 56 has been etched, UV radiation may now enter the insulating layer 46. Because the UV blocking layer 36 is present, substantially none of the UV radiation reaches the underlying electronic components that lie below the insulating layer 32 and the conductive structure 34.

Figure 11:
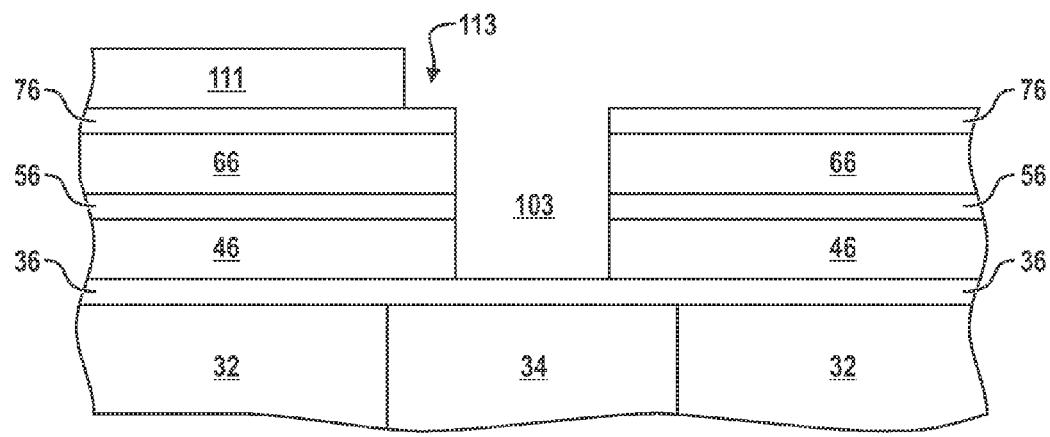
FIG. 11 includes an illustration of a cross-sectional view of the workpiece of FIG. 10 after forming a different pattern resist layer over the antireflective layer.

Returning to the hybrid process, the patterned masking layer 82 is removed using a conventional or proprietary technique, and a different patterned masking layer 111 is formed as illustrated in FIG. 11. The patterned masking layer 111 defines openings, including opening 113, corresponding to the pattern of subsequently-formed interconnects.

Figure 12:
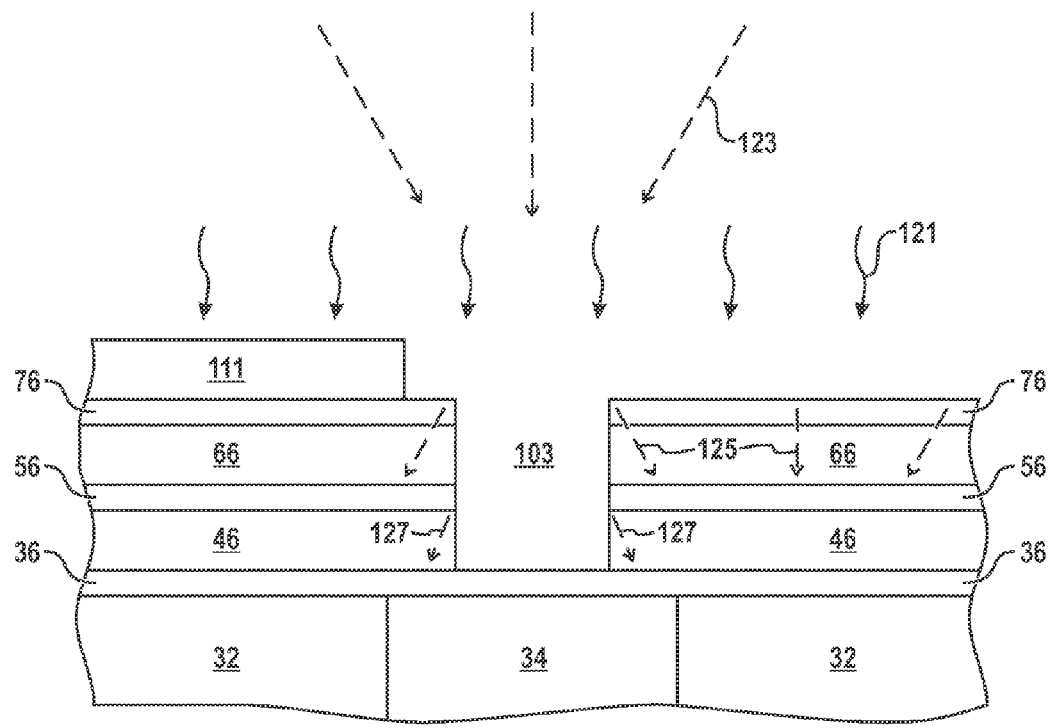
FIG. 12 includes an illustration of a cross-sectional view of the workpiece of FIG. 11 when beginning to etch the antireflective layer.

FIG. 12 includes an illustration of a cross-sectional view of the workpiece near the beginning of the etching sequence. Ions, generally illustrated by solid-line arrows 121 are directed toward the surface of the workpiece. A significant amount of UV radiation, illustrated as dashed-line arrows 123 in FIG. 12, is also generated. UV radiation within the workpiece is illustrated as dashed-line arrows 125 and 127. The UV blocking layers 36 and 56 can block UV radiation within the workpiece. Referring to FIG. 12, the exposed portions of the antireflective layer 76 can be etched.

Figure 13:
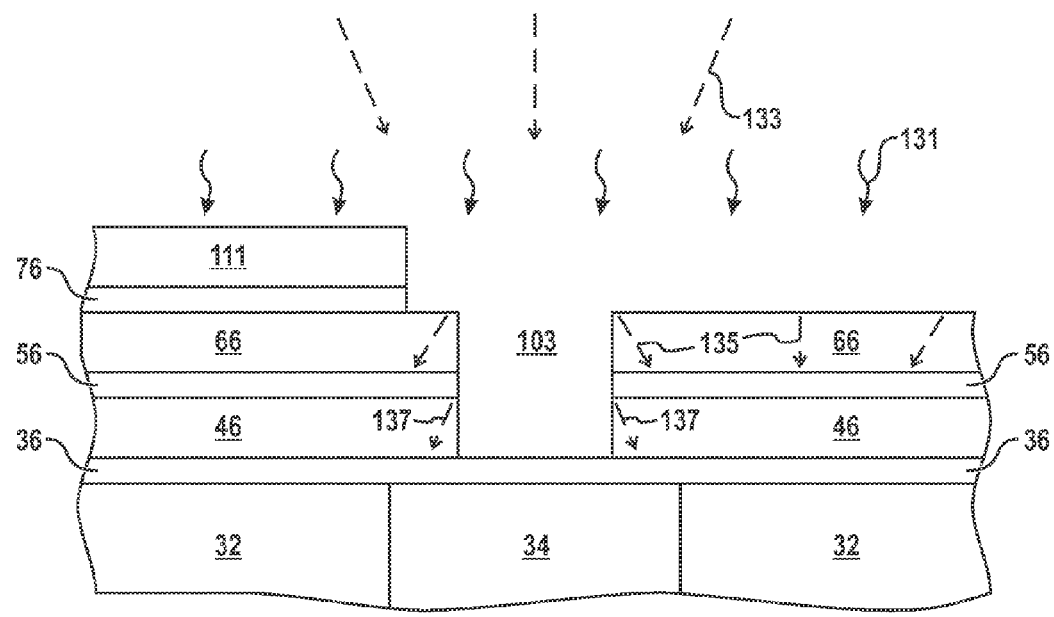
FIG. 13 includes an illustration of a cross-sectional view of the workpiece of FIG. 12 beginning to etch the upper insulating layer.

FIG. 13 includes an illustration of a cross-sectional view of a portion of the workpiece after etching the exposed portions of the antireflective layer 76 and while etching exposed portions of the insulating layer 66. In one particular embodiment, ions, generally illustrated by solid-line arrows 131 are directed toward the surface of the workpiece. A significant amount of UV radiation, illustrated as dashed-line arrows 133 in FIG. 13, is also generated. UV radiation within the insulating layer 66 is illustrated as dashed-line arrows 135 and within the insulating layer 46 is illustrated as dashed-line arrows 137.

Similar to forming the opening 103 as previously discussed, after the exposed portion of the UV blocking layer 56 has been etched, UV radiation, illustrated as dashed-line arrows 137 in FIG. 13, may now enter the insulating layer 46. Because the UV blocking layer 36 is present, substantially none of the UV radiation reaches the underlying electronic components that lie below the insulating layer 32 and the conductive structure 34.

Figure 14:
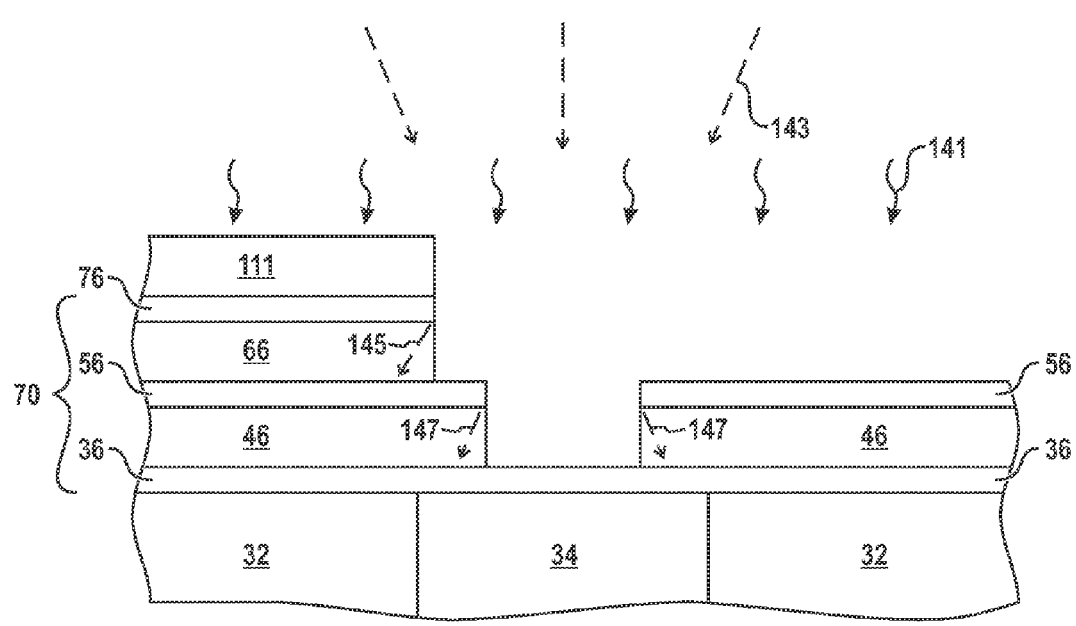
FIG. 14 includes an illustration of a cross-sectional view of the workpiece of FIG. 13 beginning to etch the upper and lower UV blocking layers.

FIG. 14 includes an illustration of a cross-sectional view of a portion of the workpiece while etching exposed portions of the UV blocking layers 36 and 56 after removing overlying portions of the insulating layers 46 and 66. Ions, generally illustrated by solid-line arrows 141 are directed toward the surface of the workpiece. A significant amount of UV radiation, illustrated as dashed-line arrows 143 in FIG. 14, is also generated. UV radiation within the insulating layer 66 is illustrated as dashed-line arrows 145, and UV radiation within the insulating layer 46 is illustrated as dashed-line arrows 147.

During a later portion of the etching sequence (not illustrated in FIG. 14), the entire thickness of the UV blocking layer 36 within the via portion of the opening will be removed. At this point in the process the underlying conductive structure 34 will be exposed. Because the conductive structure 34 does not transmit a significant amount of UV radiation, the combination of the remaining portions of the UV blocking layer 36 and the conductive structure 34 can reduce the likelihood that UV radiation will reach an underlying electronic component that is sensitive to UV radiation. Except as stated herein, all of the other etching parameters during the etching sequence are conventional or proprietary.

Figure 15:
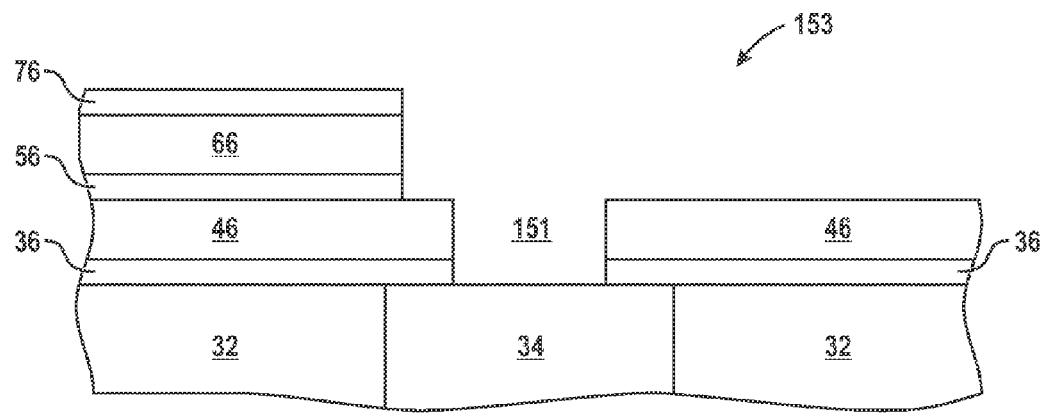
FIG. 15 includes an illustration of a cross-sectional view of the workpiece of FIG. 14 after etching a portion of the lower UV blocking layer and removing the different patterned resist layer.

The patterned masking layer 111 is removed using a conventional or proprietary technique. FIG. 15 includes an illustration of a cross-sectional view of the substrate at this point in the process flow. The ILD 70 has been patterned to form an opening that includes a via opening portion 151 and an interconnect trench portion 153. In another embodiment (not illustrated), a trench-first, via-second process sequence, in which the interconnect trench portion 153 is formed before the via opening portion 151.

Figure 16:
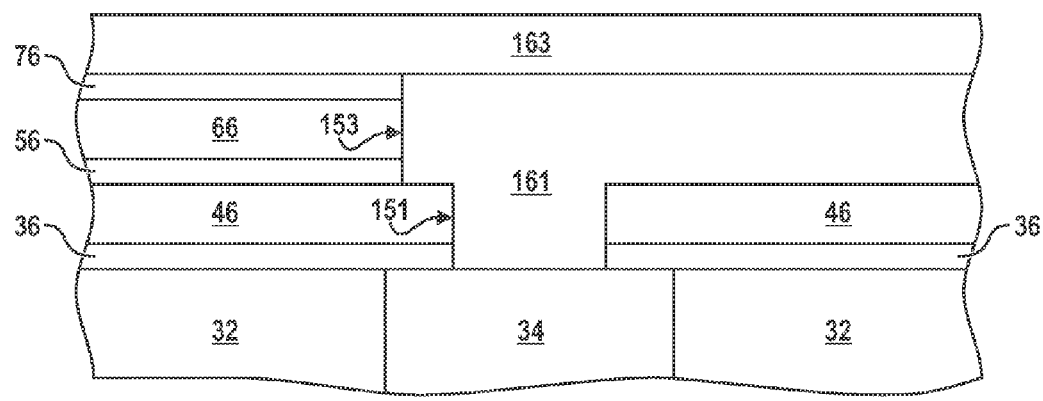
FIG. 16 includes an illustration of a cross-sectional view of the workpiece of FIG. 15 after forming a substantially completed electronic device.

FIG. 16 includes an illustration of a cross-sectional view of a substantially completed electronic device. A conductive structure 161 is formed within the opening and is electrically connected to the conductive structure 34. The conductive structure can include a single film or a plurality of films. For example, the conductive structure 161 may include an adhesion film, a barrier film, a seed film, a conductive fill material, or any combination thereof. In one embodiment, the conductive structure 161 includes aluminum, copper, or a noble metal, such as silver, gold, another suitable conductive material, or any combination thereof. A polishing or etching operation can be used to remove portions of the conductive materials that lie outside to opening to complete formation of the conductive structure 161, which in this embodiment, is a dual-inlaid structure.

Although not illustrated an additional ILD and interconnects at another level may be formed if needed or desired. After forming all of the dielectric layers and interconnect levels, an encapsulating layer 163 is then formed over the interconnects, including the interconnect 161. The encapsulating layer 163 can include a single film or a plurality of films. The encapsulating layer 163 can include a conventional or proprietary composition and be formed using a conventional or proprietary deposition technique.

The concepts described herein can be extended to other conductive structures. In one embodiment (not illustrated), a single-inlaid structure could be formed. A single-inlaid structure can be used when via plugs are formed separately from the corresponding, overlying interconnects. In another embodiment, contact openings within an ILD can be made and are described in more detail in FIGS. 17 to 24.

Figure 17:
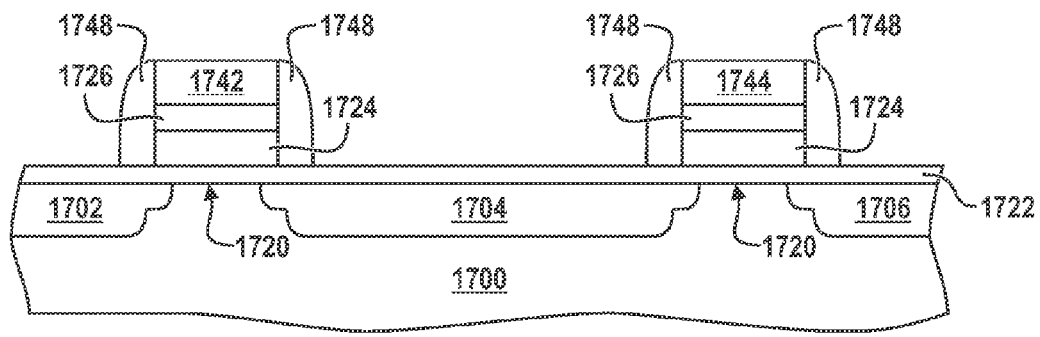
FIG. 17 includes an illustration of a cross-sectional view of a portion of another workpiece after forming spaced-apart gate electrodes over a charge storage stack.
Figure 18:
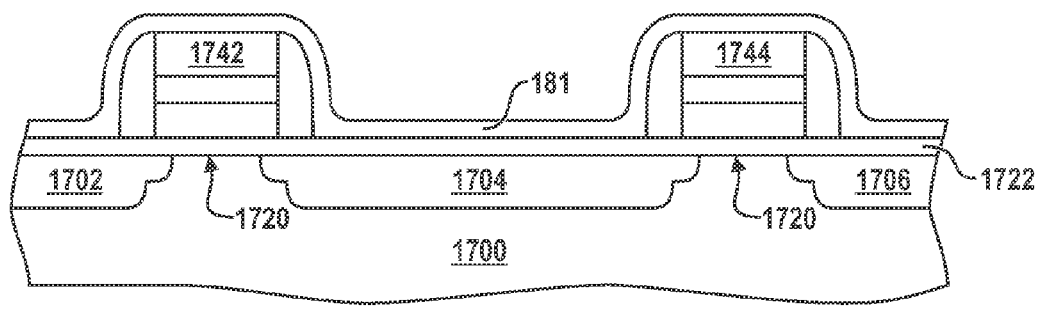
FIG. 18 includes an illustration of a cross-sectional view of the workpiece of FIG. 17 after forming a UV blocking layer.

FIG. 17 includes an illustration of a cross-sectional view of a portion of a workpiece that includes a substrate 1700. The substrate 1700 can include a monocrystalline semiconductor wafer, a semiconductor-on-insulator wafer, a flat panel display (e.g., a silicon layer over a glass electroplate), or other substrate used to form electronic devices. An oxide layer 1722, a charge storage layer 1724, and another oxide layer 1726 are formed over the substrate 1700. In one particular embodiment, the charge storage layer 1724 can include a nitride layer, a doped silicon layer, or another suitable layer capable of storing a charge. In the particular embodiment as illustrated in FIG. 17, the charge storage layer 1724 includes a nitride layer.

Gate electrodes 1742 and 1744 are formed over the charge storage stack 1720. In a particular embodiment, the gate electrodes 1742 and 1744 are parts of different word lines for memory cells within the memory array. The gate electrodes 1742 and 1744 can include doped silicon, a metal, a metal nitride, another suitable gate electrode material, or any combination thereof. The charge storage layer 1724 and the oxide layer 1726 may also be patterned at this time. Charge storage stacks 1720 in this particular embodiment include portions of the oxide layer 1722, the charge storage layer 1724, and the oxide layer 1726 that underlie the gate electrodes 1742 and 1744. In this particular embodiment, portions of the oxide layer 1722 can remain over the substrate 1700 between the gate electrodes 1742 and 1744.

Spacers 1748 are formed adjacent to the sides of the gate electrodes 1742 and 1744. Source/drain regions 1702, 1704, and 1706 are formed within the substrate 1700 after forming the gate electrodes 1742 and 1744. Portions of the gate electrodes 1742 and 1744 and regions within the substrate (e.g., source/drain regions 1702, 1704, and 1706) can be silicided if desired. The silicide can include $TiSi_2$, $TaSi_2$, $CoSi_2$, or the like. The silicidation can be performed using a conventional or proprietary technique. The processing sequence to form the workpiece as illustrated in FIG. 17 can be performed using conventional or proprietary thermal growth, deposition, patterning, and implantation techniques.

A UV blocking layer 181 is formed over the gate electrodes 1742 and 1744 and the oxide layer 1722. In one particular embodiment, the UV blocking layer 181 is formed directly on the gate electrodes 1742 and 1744. In one embodiment, the UV blocking layers 181 can be formed no more than 90 nm or no more than 20 nm from the gate electrodes 1742 and 1744. For example, an intervening layer, such as an etch-stop or adhesion layer (not illustrated), may be formed after forming the workpiece as illustrated in FIG. 17 and before forming the UV blocking layer 181. The etch-stop or adhesion layer has a composition different from the UV blocking layer 181. For example, if the UV blocking layer is an oxide, the etch-stop layer can be a nitride. The UV blocking layer 181 can have a composition and thickness and be formed using any of the embodiments as described with respect to the UV blocking layer 36.

Figure 19:
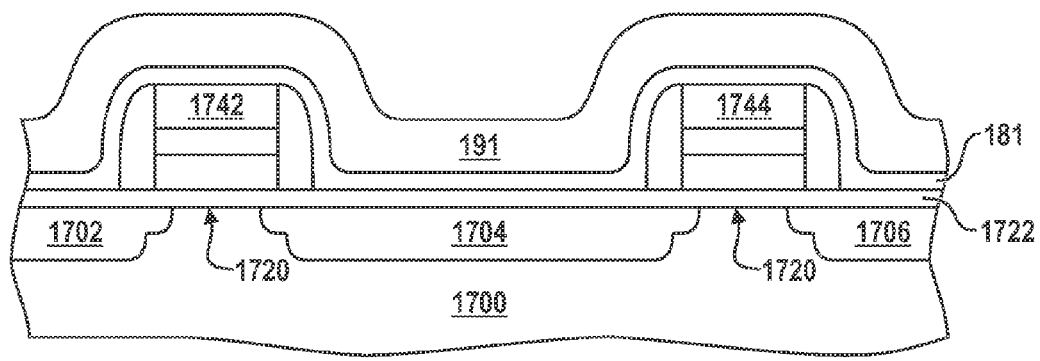
FIG. 19 includes an illustration of a cross-sectional view of the workpiece of FIG. 18 after forming an insulating layer over the UV blocking layer.

FIG. 19 includes an illustration of a cross-sectional view of the workpiece after forming an insulating layer 191 over the UV blocking layer 181. The insulating layer 191 can have a composition and thickness and be formed using any of the embodiments as described with respect to the insulating layer 46. In one particular embodiment, the insulating layer 191 is at least 4 times thicker or at least 8 times thicker than the UV blocking layer 181.

Figure 20:
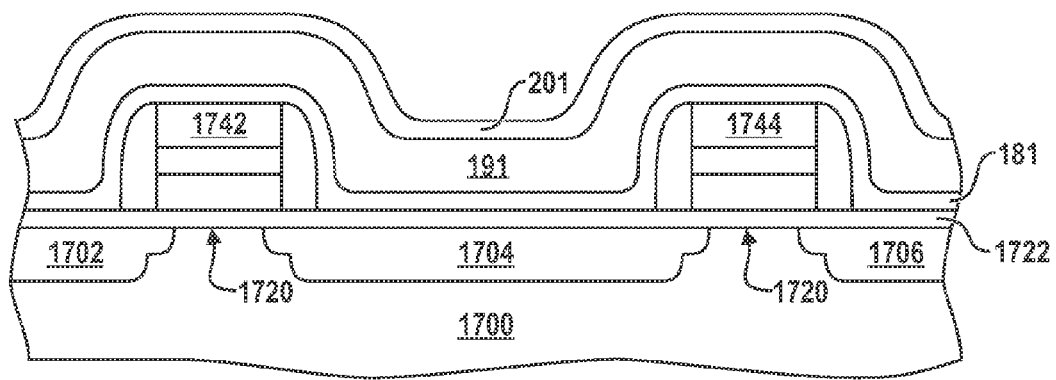
FIG. 20 includes an illustration of a cross-sectional view of the workpiece of FIG. 21 after forming an antireflective layer over the insulating layer.

FIG. 20 includes an illustration of a cross-sectional view of the workpiece after forming an antireflective layer 201 over the insulating layer 191. The antireflective layer 201 can have a composition and thickness and be formed using any of the embodiments as described with respect to the antireflective layer 76. At this point in the process, an ILD 200 has been formed and includes the UV blocking layer 181, the insulating layer 191, and the antireflective layer 201.

Figure 21:
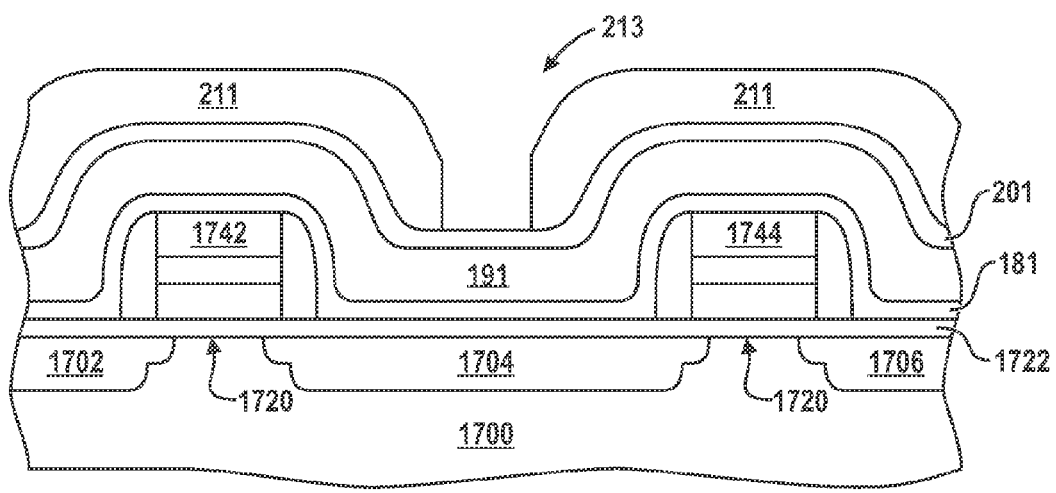
FIG. 21 includes an illustration of a cross-sectional view of the workpiece of FIG. 20 after forming a pattern resist layer over the antireflective layer.

FIG. 21 includes an illustration of a cross-sectional view of a portion of the workpiece after forming a patterned masking layer 211 over the ILD 200. The patterned masking layer 211 can have a composition and thickness and be formed using any of the embodiments as described with respect to the patterned masking layer 82.

The etching considerations described with respect to FIGS. 9 to 14 may be taken into account when developing a contact etching sequence using the workpiece as illustrated in FIG. 21.

Figure 22:
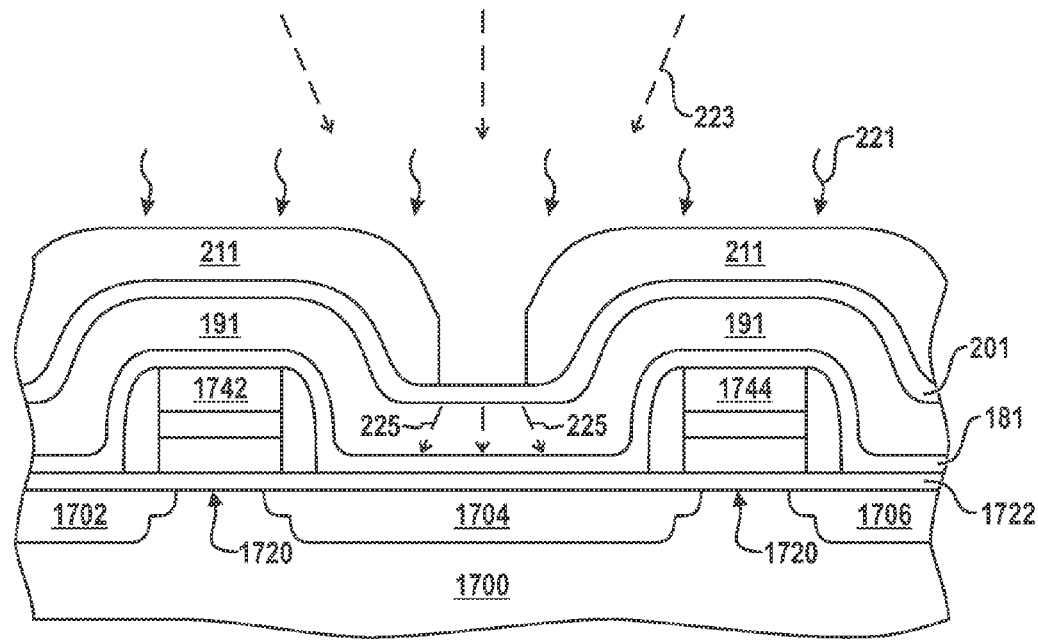
FIG. 22 includes an illustration of a cross-sectional view of the workpiece of FIG. 21 when beginning to etch the antireflective layer.

Attention is now directed to etching the workpiece. FIG. 22 includes an illustration of a cross-sectional view of the workpiece near the beginning of an etching sequence. Ions, generally illustrated by solid-line arrows 221 are directed toward the surface of the workpiece. A significant amount of UV radiation, illustrated as dashed-line arrows 223 in FIG. 22, is also generated. UV radiation within the workpiece is illustrated as dashed-line arrows 225. The UV blocking layer 181 can block UV radiation within the workpiece to reduce the likelihood that UV radiation will reach the underlying layers. Referring to FIG. 22, the exposed portions of the antireflective layer 201 can be etched during a first time period, and the exposed portions of the insulating layer 191 can be etched during a second time period. The etching parameters used for any of the embodiments as described above with respect to the antireflective layer 76 and the insulating layers 46 and 66 can be used when etching the antireflective layer 201 and the insulating layer 191.

The UV blocking layer 181 can be etched during a third time period. In one embodiment, the etching parameters used for any of the embodiments as described above with respect to the UV blocking layer 56 can be used when etching the UV blocking layer 181. Because the charge storage stacks 1720 underlie the gate electrodes 1742 and 1744, the charge storage stacks 1720 will be exposed to only a very small portion of UV radiation (due to reflections at layer interfaces) after removing a portion of the UV blocking layer 181. Thus, the continued UV exposure after patterning the UV blocking layer 181 may not affect the performance of the memory cells.

The etch sequence can be performed to pattern the charge storage stack 1720 using a conventional or proprietary process.

If UV radiation exposure of the charge storage stacks 1720 is still a concern, the power used to etch the UV blocking layer 181 can be reduced to reduce the intensity of the UV radiation in the plasma. For example, if the workpiece includes a nominal 200 mm substrate, the power may be no greater than 1000 watts. After reading this specification, skilled artisans will be able to determine the etch parameters, including power, that meet their needs or desires, particularly with respect to the intensity of UV radiation to which layers or other portions of electronic components are to be exposed.

Figure 23:
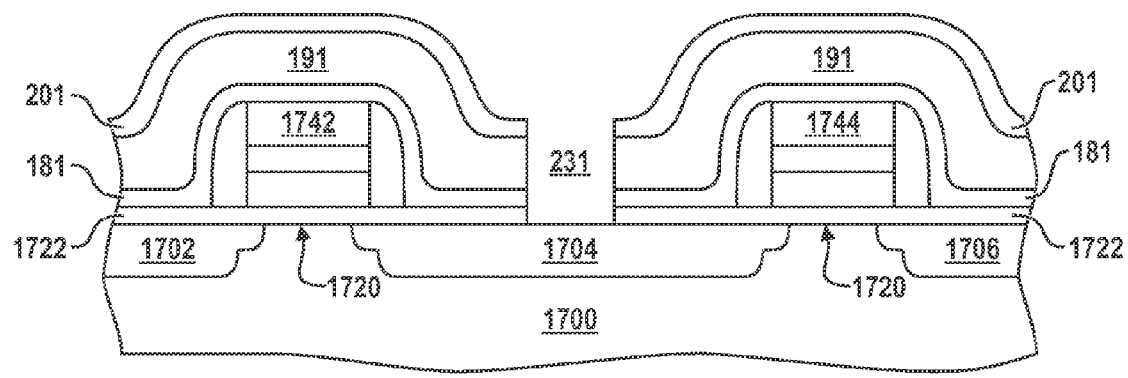
FIG. 23 includes an illustration of a cross-sectional view of the workpiece of FIG. 22 after etching an opening through the antireflective, insulating, and UV blocking layers.

FIG. 23 includes an illustration of a cross-sectional view of the workpiece after removing the patterned masking layer 211 using a conventional or proprietary ashing or solvent-based removal technique. At this point in the process, a contact opening 231 has been formed that extends to the source/drain region 1704. Other contact openings (not illustrated) may be formed to the other source/drain regions 1702 and 1706, the gate electrodes 1742 and 1744, other parts of the workpiece, or any combination thereof.

Figure 24:
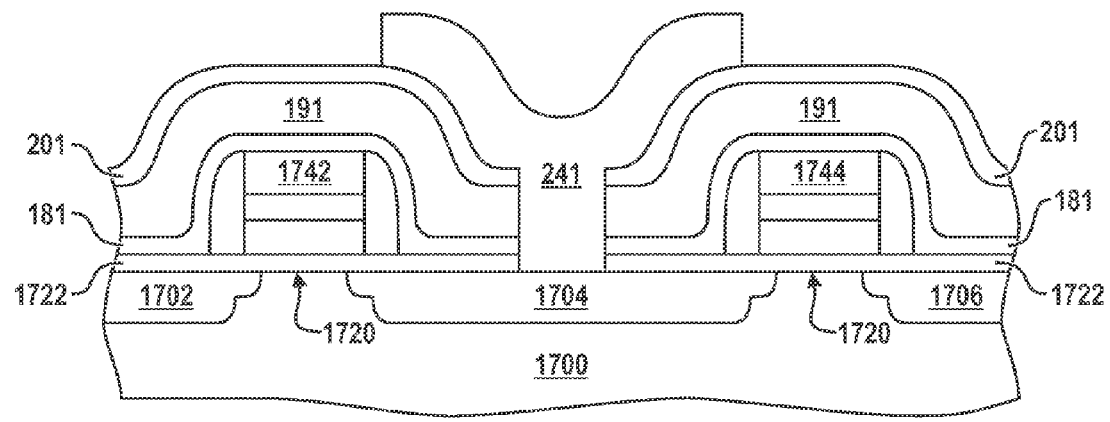
FIG. 24 includes an illustration of a cross-sectional view of the workpiece of FIG. 23 after forming an interconnect within the opening.

FIG. 24 includes an illustration of a cross-sectional view of a substantially completed electronic device. A conductive structure 241 is formed within the opening and is electrically connected to the source/drain region 1704. The conductive structure can include a single film or a plurality of films. For example, the conductive structure 241 may include an adhesion film, a barrier film, and a conductive film. In one embodiment, the conductive structure 241 includes aluminum, polysilicon, tungsten, another suitable conductive material, or any combination thereof. An etching operation can be used to remove portions of the conductive materials to complete formation of the conductive structure 241. Thus, the conductive structure 241 does not have to be an inlaid structure.

In another embodiment (not illustrated), the insulation layer 191 can be planarized before forming the antireflective layer 201, and a polishing operation could be performed to form a single inlaid structure (e.g., a contact plug). In another embodiment (not illustrated), exposed portions of the antireflective layer, such as the antireflective layer 76 or 201, may be removed after the conductive structure, such as the conductive structure 161 or 241, has been formed.

After reading the specification, skilled artisans will appreciate that many other embodiments are possible, and that the present invention is not limited solely to embodiments illustrated and described herein. For example, other embodiments may include combinations of any of the foregoing aspects from the different designs of the diffuser.

Figure 25:
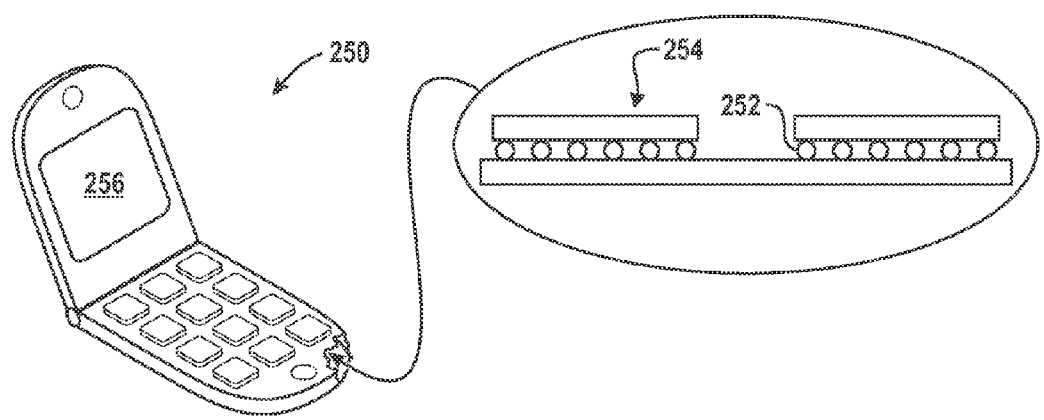
FIG. 25 includes an illustration of a cross sectional view of a system wherein a processor is coupled to a display and an electronic device formed by a process described herein.

An electronic device formed using any one of the foregoing embodiments can be incorporated into a system, such as a system 250 as illustrated in FIG. 25. The system 250 includes the electronic device 252 formed by the process described herein. In one embodiment, the electronic device 252 can be an integrated circuit that includes NVM cells or other components or circuits that are sensitive to UV radiation where fabricating the electronic device 252. The electronic device 252 can be part of a standalone memory integrated circuit or may be part of a different type of integrated circuit.

The system 250 also includes a processor 254 is coupled to a display 256 and the electronic device 252. The processor 254 can include a central processing unit, a graphical processing unit, another suitable processing unit, or any combination thereof. The processor 254 may be part of a microcontroller, a microprocessor, a digital signal processor, another suitable data processing integrated circuit or the like. The processor 254 and the electronic device 252 can be separate integrated circuits mounted on the same printed wiring board or different printed wiring boards. In another embodiment, the processor 254 and the electronic device 252 may reside within the same integrated circuit. In one specific embodiment, the processor 254 can read data from the electronic device 252 and render or otherwise provide information to be displayed on the display 256 of the system 250.

The embodiments as described herein can be significantly less adversely affected by UV radiation that can be generated in plasmas used in etching films and depositing films. A UV blocking layer can be located closer to memory cells or other electronic components or portions thereof to reduce the likelihood that UV radiation changes a charge or otherwise interferes with or compromises electrical characteristics during the normal operation of such memory cells, electronic components, or portions thereof. For example, the punchthrough voltage may be increased, the threshold voltage may be closer to a desired value, a distribution of threshold voltages between memory cells or transistors may be smaller, etc.

In one embodiment, the process used to form the electronic device can be developed such that the likelihood of any UV radiation reaching underlying UV sensitive components is substantially zero. Referring to FIG. 15, after the opening has been formed, a portion of the conductive structure 34 is exposed. The UV blocking layer 36 and the conductive structure 34 can include the same material or different materials that substantially block the UV radiation from reaching memory cells and other electronic components that underlie the insulating layer 32, conductive structure 34, or both. Thus, a combination of the UV blocking layer 36 and the conductive structure 34 may substantially block all of the UV radiation.

Figure 2:
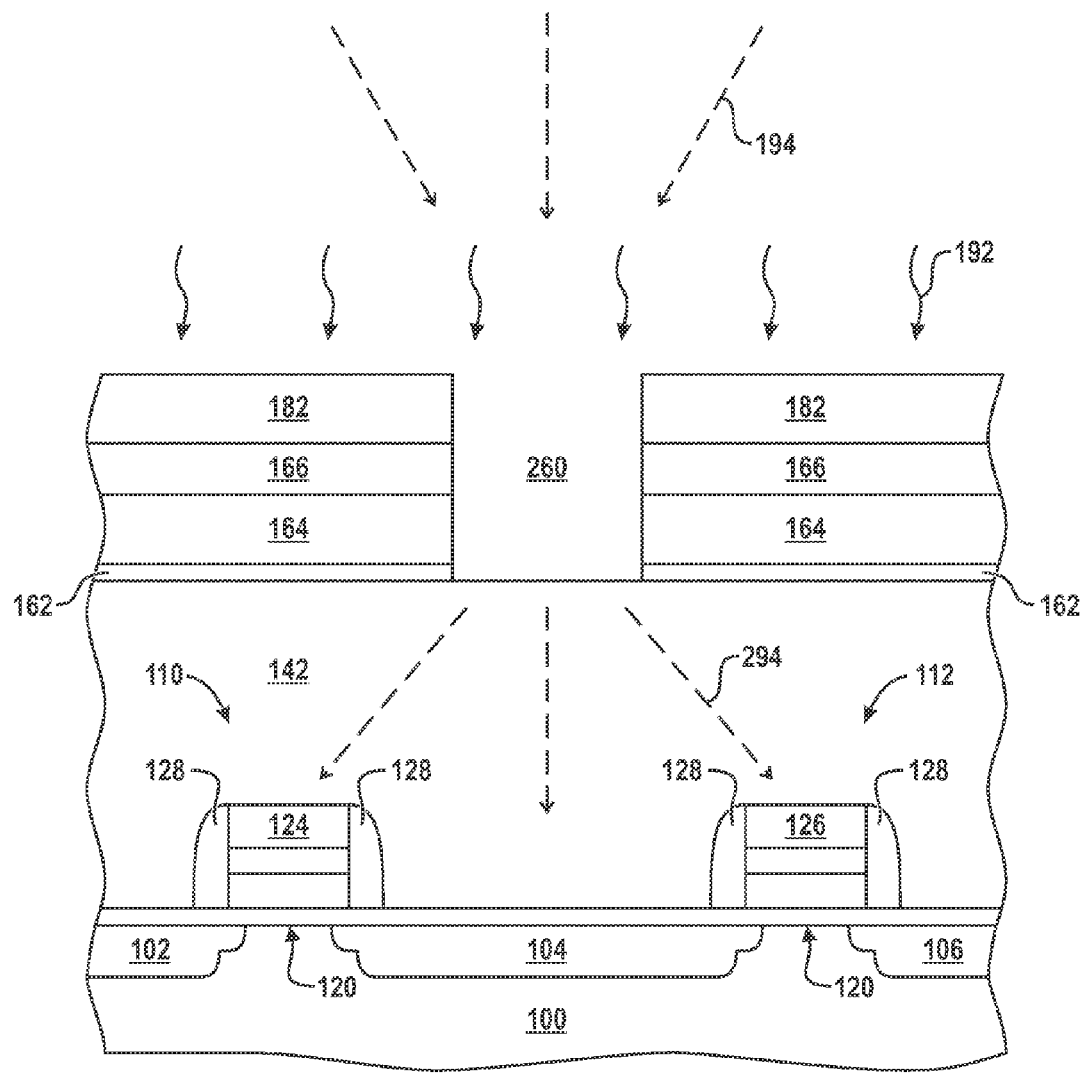
FIG. 2 includes an illustration of a cross-sectional view of the workpiece of FIG. 1 at a later point in time while etching the opening. (Prior art)

In another embodiment, a combination of features may not be able to prevent substantially all of the UV radiation from reaching underlying portions of a memory cell or other electronic component. Referring to FIG. 23, within a stack of layers that form an interlevel dielectric layer, the UV blocking layer 181 is placed relatively closer to the substrate as compared to the insulating layer 191, which may be substantially thicker than the UV blocking layer 181. Thus, the charge storage stack 1720, which may be sensitive to the UV radiation, is only exposed for a relatively shorter time during the etching sequence, as compared to the process as described with respect to FIGS. 1 and 2. Further, most of the charge storage layer 1724 and the oxide layer 1726 are removed when forming the gate electrodes 1742 and 1744. The charge storage stacks 1720 are spaced away from the location where UV radiation passes through an opening in the UV blocking layer 181. The separation of the charge storage stack 1720 from the opening in the UV blocking layer 181 can significantly reduce the unintended charging of the charge storage stack 1720 during processing operations when UV radiation is present. This memory cell architecture can reduce the likelihood that UV radiation would interfere with the normal operation of the adjacent memory cells.

An existing process flow can be modified to include UV blocking layer near the bottom of an ILD. A UV blocking layer can be deposited as the first (lowest) layer in the interlevel dielectric layer or may be formed over a relatively thin etch-stop or adhesion layer. When the UV blocking layer includes a silicon-rich insulating layer, the etch chemistry may be selected to have a larger fluorine concentration, as compared to an etch chemistry tailored more for etching $SiO_2$ or $Si_3N_4$. After reading this specification, skilled artisans will understand how to modify an existing process flow to take advantage of the additional UV protection of the UV blocking layer.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a first UV blocking layer over a conductive feature, wherein the first UV blocking layer lies within 90 nm of the conductive structure. The process can also include forming a first insulating layer over the first UV blocking layer, and patterning the first insulating layer and the first UV blocking layer to form a first opening extending to the conductive feature. During the process, the first UV blocking layer is exposed to UV radiation.

In one embodiment of the first aspect, the process further includes forming an antireflective layer over the first insulating layer, wherein patterning the first insulating layer and the first UV blocking layer includes patterning the antireflective layer. In another embodiment, the first insulating layer is at least 4 times thicker than the first UV blocking layer. In still another embodiment, the process further includes forming a conductive layer over the first insulating layer and within the first opening, and removing a portion of the conductive layer lying outside the first opening to form a conductive structure that is electrically connected to the conductive feature.

In yet another embodiment, the process further includes forming a second UV blocking layer over the first insulating layer, forming a second insulating layer over the second UV blocking layer, and patterning the second insulating layer and the second UV blocking layer to form a second opening, wherein a bottom of the second opening is spaced apart from the conductive feature. In a particular embodiment, each of the first opening and the second opening overlies the conductive feature. In a more particular embodiment, the process further includes forming a conductive layer over the second insulating layer and within the first opening and the second opening, and removing a portion of the conductive layer overlying outside the second insulating layer to form a conductive structure that is electrically connected to the conductive feature.

In another particular embodiment of the first aspect, patterning the first insulating layer and the first UV blocking layer and patterning the second insulating layer and the second UV blocking layer includes forming a first patterned resist layer over the second insulating layer, wherein the first patterned resist layer includes a third opening, and wherein from a top view, the third opening corresponds to a shape of the first opening. Patterning the first insulating layer and the first UV blocking layer and patterning the second insulating layer and the second UV blocking layer also can include etching the second insulating layer and the second UV blocking layer to form a fourth opening overlying the conductive feature. Patterning the first insulating layer and the first UV blocking layer and patterning the second insulating layer and the second UV blocking layer can further include forming a second patterned resist layer over the second insulating layer, wherein the second patterned resist layer includes a fifth opening, and wherein from the top view, the fifth opening corresponds to a shape of the second opening. Patterning the first insulating layer and the first UV blocking layer and patterning the second insulating layer and the second UV blocking layer can yet further include etching the first insulating layer, the first UV blocking layer, the second insulating layer, and the second UV blocking layer to form the first opening and the second opening.

In still another particular embodiment of the first aspect, patterning the first insulating layer and the first UV blocking layer and patterning the second insulating layer and the second UV blocking layer includes forming a first patterned resist layer over the second insulating layer, wherein the first patterned resist layer includes a third opening, and wherein from a top view, the third opening corresponds to a shape of the second opening. Patterning the first insulating layer and the first UV blocking layer and patterning the second insulating layer and the second UV blocking layer can also include etching the second insulating layer and the second UV blocking layer to form the second opening. Patterning the first insulating layer and the first UV blocking layer and patterning the second insulating layer and the second UV blocking layer can further include forming a second patterned resist layer over the second insulating layer, wherein the second patterned resist layer includes a fourth opening, and wherein from the top view, the fourth opening corresponds to a shape of the first opening. Patterning the first insulating layer and the first UV blocking layer and patterning the second insulating layer and the second UV blocking layer can yet further include etching the first insulating layer and the first UV blocking layer to form the first opening.

In a further particular embodiment of the first aspect, the first UV blocking layer and the second UV blocking layer have substantially a first same composition, and the first insulating layer and the second insulating layer have substantially a second same composition.

In another embodiment of the first aspect, the first UV blocking layer includes a silicon-rich insulating layer. In still another embodiment, patterning the first insulating layer and the first UV blocking layer includes etching the first insulating layer using a first etching chemistry having a first fluorine concentration, and etching the first UV blocking layer using a second etching chemistry having a second fluorine concentration that is greater than the first fluorine concentration. In yet another embodiment, patterning the first insulating layer and the first UV blocking layer is performed by plasma etching using a radio frequency in a range of 25 to 29 MHz. In a further embodiment, forming the first insulating layer is performed using a plasma-enhanced chemical vapor deposition technique.

In a second aspect, a process of forming an electronic device can including forming a first ultraviolet UV blocking layer over a conductive feature, forming a first insulating layer over the first UV blocking layer, forming a second UV blocking layer over the first insulating layer, and forming a second insulating layer over the second UV blocking layer. The process can also include patterning the second insulating layer, second UV blocking layer, first insulating layer and the first UV blocking layer to form a first opening and a second opening, wherein the first opening extends to the conductive feature, the second opening overlies the conductive feature, and a bottom of the second opening is spaced apart from the conductive feature, and during patterning, the first UV blocking layer is exposed to UV radiation within a plasma generated using a radio frequency in a range of 25 to 29 MHz. The process can further include forming a conductive layer over the second insulating layer and within the first and second openings, and polishing the conductive layer to remove a portion of the conductive layer lying outside the first and second openings to form a conductive structure that is electrically connected to the conductive feature.

In one embodiment of the second aspect, each of the first UV blocking layer and the second UV blocking layer is a silicon-rich oxide, a silicon-rich nitride, a silicon-rich oxynitride, or any combination thereof. In another embodiment, the process further includes forming an antireflective layer over the first UV blocking layer, wherein patterning the second insulating layer, second UV blocking layer, first insulating layer and the first UV blocking layer includes patterning the antireflective layer.

In a third aspect, an electronic device can include a conductive feature and a first ultraviolet UV blocking layer overlying the conductive feature. The electronic device can also include a first insulating layer overlying the first UV blocking layer, wherein the first insulating layer is at least 4 times thicker than the first UV blocking layer. The electronic device can further include a conductive structure extending into a first opening within the first insulating layer and the UV blocking layer, wherein the conductive structure is electrically connected to the conductive feature.

In one embodiment of the third aspect, the electronic device further includes a second UV blocking layer overlying the first insulating layer, and a second insulating layer overlying the second UV blocking layer. The first opening can include a via opening, the second opening can include an interconnect trench, and the conductive structure includes a dual-inlaid structure that extends into the first and second openings.

In any of the foregoing embodiments, a system can include any of the electronic devices described herein. The system can also include a processor and a display, wherein the processor electrically coupled to the electronic device, and the display electrically coupled to the processor.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:
1. An electronic device comprising:
a conductive feature;
a first ultraviolet (UV) blocking layer overlying the conductive feature, the first UV blocking layer being within 90 nm of the conductive feature;
a first insulating layer overlying the first UV blocking layer, wherein the first insulating layer is at least 4 times thicker than the first UV blocking layer, a via opening extending through the first insulating layer and the first UV blocking layer;
a second UV blocking layer overlying the first insulating layer; and a second insulating layer overlying the second UV blocking layer, an interconnect trench defined in the second UV blocking layer and the second insulating layer; and a conductive structure extending into the via opening within the first insulating layer and the first UV blocking layer and along the interconnect trench defined in the second UV blocking layer and the second insulating layer, wherein the conductive structure is electrically connected to the conductive feature.

2. The electronic device of claim 1, wherein the conductive structure includes a dual-inlaid structure that extends into the via opening and interconnect trench.

3. The electronic device of claim 1, further comprising an antireflective layer overlying the first insulating layer.

4. The electronic device of claim 1, wherein the first UV blocking layer includes a silicon-rich material.

5. The electronic device of claim 1, wherein each of the first UV blocking layer and the second UV blocking layer is a silicon-rich oxide, a silicon-rich nitride, a silicon-rich oxynitride, or any combination thereof.

6. The electronic device of claim 1, the first UV blocking layer and the second UV blocking layer have substantially a first same composition; and the first insulating layer and the second insulating layer have substantially a second same composition.

7. A system comprising:
an electronic device comprising:
a conductive feature;
a first ultraviolet (UV) blocking layer overlying the conductive feature, the first UV blocking layer being within 90 nm of the conductive feature;
a first insulating layer overlying the first UV blocking layer, wherein the first insulating layer is at least 4 times thicker than the first UV blocking layer, a via opening extending through the first insulating layer and the first UP blocking layer;
a second UV blocking layer overlying the first insulating layer; and
a second insulating layer overlying the second UP blocking layer, an interconnect trench defined in the second UV blocking layer and the second insulating layer; and
a conductive structure extending into the via opening within the first insulating layer and the first UV blocking layer and along the interconnect trench defined in the second UV blocking layer and the second insulating layer, wherein the conductive structure is electrically connected to the conductive feature;
a processor electrically coupled to the electronic device; and
a display electrically coupled to the processor.

8. The system of claim 7, wherein the conductive structure includes a dual-inlaid structure that extends into the via opening and interconnect trench.

9. The system of claim 7, wherein the electronic device further comprises an antireflective layer overlying the first insulating layer.

10. The system of claim 7, wherein the first UV blocking layer includes a silicon-rich material.

11. The system of claim 7, wherein each of the first UV blocking layer and the second UP blocking layer is a silicon-rich oxide, a silicon-rich nitride, a silicon-rich oxynitride, or any combination thereof.

12. The system of claim 7, wherein the first UV blocking layer and the second UP blocking layer have substantially a first same composition; and the first insulating layer and the second insulating layer have substantially a second same composition.

13. An electronic device comprising:
a conductive feature;
a first ultraviolet (UV) blocking layer overlying the conductive feature, the first UV blocking layer being within 90 nm of the conductive feature;
a first insulating layer overlying the first UV blocking layer, a first opening extending through the first insulating layer and the first UV blocking layer;
a second UV blocking layer overlying the first insulating layer; and
a second insulating layer overlying the second UV blocking layer, a second opening defined in the second UV blocking layer and the second insulating layer; and
a conductive structure electrically connected to the conductive feature and extending into the first and second openings.

14. The electronic device of claim 13, wherein the conductive structure includes a dual-inlaid structure that extends into the via opening and interconnect trench.

15. The electronic device of claim 13, further comprising an antireflective layer overlying the first insulating layer.

16. The electronic device of claim 13, wherein the first UV blocking layer includes a silicon-rich material.

17. The electronic device of claim 13, wherein each of the first UV blocking layer and the second UV blocking layer is a silicon-rich oxide, a silicon-rich nitride, a silicon-rich oxynitride, or any combination thereof.

18. The electronic device of claim 13, wherein the first insulating layer is at least 4 times thicker than the first UV blocking layer.

19. The electronic device of claim 13, wherein the first opening is a via opening.

20. The electronic device of claim 13, wherein the second opening is an interconnect trench.

* * * * *